United States Patent
Okano et al.

(10) Patent No.: US 10,715,086 B2
(45) Date of Patent: Jul. 14, 2020

(54) AMPLIFIER CIRCUIT

(71) Applicant: DENSO TEN Limited, Kobe-shi, Hyogo (JP)

(72) Inventors: Tetsuro Okano, Kobe (JP); Kenji Kawai, Kobe (JP); Masayoshi Hirai, Kobe (JP)

(73) Assignee: DENSO TEN LIMITED, Kobe (JP)

( * ) Notice: Subject to any disclaimer, the term of this patent is extended or adjusted under 35 U.S.C. 154(b) by 4 days.

(21) Appl. No.: 16/196,961

(22) Filed: Nov. 20, 2018

(65) Prior Publication Data

US 2019/0190454 A1   Jun. 20, 2019

(30) Foreign Application Priority Data

Dec. 15, 2017   (JP) .................. 2017-240476

(51) Int. Cl.
*H03F 1/02* (2006.01)
*H03F 3/19* (2006.01)
*H03F 1/34* (2006.01)

(52) U.S. Cl.
CPC ............ *H03F 1/0211* (2013.01); *H03F 1/34* (2013.01); *H03F 1/347* (2013.01); *H03F 3/19* (2013.01); *H03F 2200/534* (2013.01); *H03F 2200/541* (2013.01)

(58) Field of Classification Search
CPC .................................................. H03F 1/0211
USPC ....................................................... 330/296
See application file for complete search history.

(56) References Cited

U.S. PATENT DOCUMENTS

| | | | | |
|---|---|---|---|---|
| 3,229,119 A | * | 1/1966 | Bohn | H03K 19/088 326/128 |
| 3,376,388 A | * | 4/1968 | Reiffin | H03F 3/3091 381/121 |
| 3,555,442 A | * | 1/1971 | Gardner | H03F 3/183 330/273 |
| 3,575,649 A | * | 4/1971 | Mathews | H02K 33/18 318/127 |
| 4,718,119 A | * | 1/1988 | Salzer | H04B 10/6931 330/278 |
| 5,537,080 A | * | 7/1996 | Chawla | H03F 1/0233 330/266 |
| 2009/0096528 A1 | * | 4/2009 | Nakai | H03G 1/0088 330/278 |

FOREIGN PATENT DOCUMENTS

JP   2002-198747 A   7/2002

* cited by examiner

*Primary Examiner* — Patricia T Nguyen
(74) *Attorney, Agent, or Firm* — Oliff PLC

(57) ABSTRACT

An amplifier circuit includes a first transistor, a second transistor, a first pathway and a second pathway. The first transistor amplifies an external signal that is input from outside the amplifier circuit. The second transistor amplifies a detection signal that detects a level of the external signal. The first pathway is connected between a collector of the first transistor and a base of the second transistor to supply the detection signal that is output from the collector of the first transistor to the base of the second transistor. The second pathway is connected between an emitter of the first transistor and the base of the second transistor to supply a bias voltage from the emitter of the first transistor to the base of the second transistor.

7 Claims, 4 Drawing Sheets ns10715086B2

AMPLIFIER CIRCUIT

BACKGROUND OF THE INVENTION

Field of the Invention

The invention relates to an amplifier circuit.

Description of the Background Art

Conventionally, it has been known that an amplifier circuit that amplifies an external signal received by an antenna or the like is provided with an automatic gain control (AGC) circuit that automatically adjusts an amplifier gain according to a level of the external signal. In such an amplifier circuit, for example, negative feedback is applied from an emitter of a first transistor to a collector via a transformer (for example, refer to the patent document 1).

FIG. 4 shows an amplifier circuit 1A that includes a conventional AGC circuit. The amplifier circuit 1A includes a first transistor Q11 and a second transistor Q12. The external signal that is transmitted from outside is input to a base of the first transistor Q11 of the amplifier circuit 1A. The external signal is amplified by the first transistor Q11 and such an amplified external signal (hereinafter, also referred to as an amplified signal) is output from the collector.

The emitter of the first transistor Q11 is connected via a transformer T11 to the collector of the first transistor Q11. Thus, it is possible to apply the negative feedback from the emitter of the first transistor Q11 to the collector via the transformer T11. In the amplifier circuit 1A of a conventional example, by applying the negative feedback as described above, it is possible to supply both a detection signal to detect a level of the amplified signal and a bias voltage to stably operate a transistor from the emitter of the first transistor Q11 to the second transistor Q12.

The second transistor Q12, whose base is supplied with both the detection signal and the bias voltage, can amplify the detection signal and output the amplified detection signal as a level detection signal. As described above, in the amplifier circuit 1A of the conventional example, it is possible to supply both the detection signal and the bias voltage from the emitter of the first transistor Q11 to the second transistor Q12.

However, it is not preferable that the transformer is used for the amplifier circuit in terms of cost containment. On the other hand, when the amplifier circuit is configured without using the transformer, since a level of an emitter signal of the first transistor decreases, it is not possible to supply the detection signal from the emitter of the first transistor.

SUMMARY OF THE INVENTION

According to one aspect of the invention, an amplifier circuit includes: a first transistor that amplifies an external signal that is input from outside the amplifier circuit; a second transistor that amplifies a detection signal that detects a level of the external signal; a first pathway that is connected between a collector of the first transistor and a base of the second transistor to supply the detection signal that is output from the collector of the first transistor to the base of the second transistor; and a second pathway that is connected between an emitter of the first transistor and the base of the second transistor to supply a bias voltage from the emitter of the first transistor to the base of the second transistor.

According to the invention, it is possible to supply a sufficient level of the detection signal from the first transistor to the second transistor without using a transformer. In addition, it is possible to supply a stable bias voltage to the second transistor.

According to another aspect of the invention, the amplifier circuit further includes a gain controller that attenuates the external signal that is input to a base of the first transistor based on the detection signal amplified by the second transistor.

According to the invention, it is possible to automatically control a gain of the external signal that is input to the first transistor.

Therefore, an object of the invention is to provide the amplifier circuit that can supply the sufficient level of the detection signal from the first transistor to the second transistor without using the transformer and supply the stable bias voltage to the second transistor.

These and other objects, features, aspects and advantages of the invention will become more apparent from the following detailed description of the invention when taken in conjunction with the accompanying drawings.

DESCRIPTION OF THE EMBODIMENTS

In the following, an embodiment of an amplifier circuit disclosed in the application will be described in detail with reference to the accompanying figures. The invention is not limited to the embodiment described in the following.

<Configuration of Antenna Amplifier and Amplifier Circuit>

Figure 1:
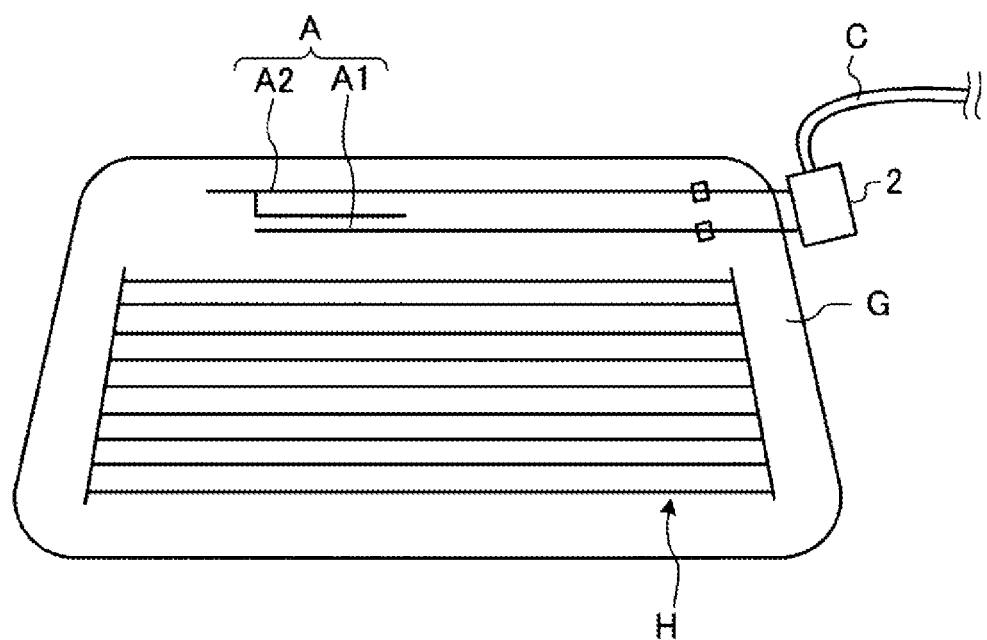
FIG. 1 is a diagram illustrating an outline of an antenna amplifier according to an embodiment.

First, description will be made on configurations of an amplifier circuit 1 and an antenna amplifier 2 according to the embodiment with reference to FIG. 1 and FIG. 2. FIG. 1 is a diagram illustrating an outline of the antenna amplifier 2 according to the embodiment.

As illustrated in FIG. 1, a rear glass G of a vehicle is provided with an antenna A and a heater H. The antenna A includes a FM antenna A1 that mainly receives an FM broadcast radio wave, for example, in a frequency bandwidth of approximately 100 MHz and an AM antenna A2 that mainly receives an AM broadcast radio wave, for example, in a frequency bandwidth of approximately 1 MHz.

An external signal received by the antenna A is amplified by the antenna amplifier 2 that is installed in proximity to the rear glass G The external signal amplified by the antenna amplifier 2 is transmitted via a coaxial cable C to a playback apparatus that is installed inside the vehicle.

Figure 2:
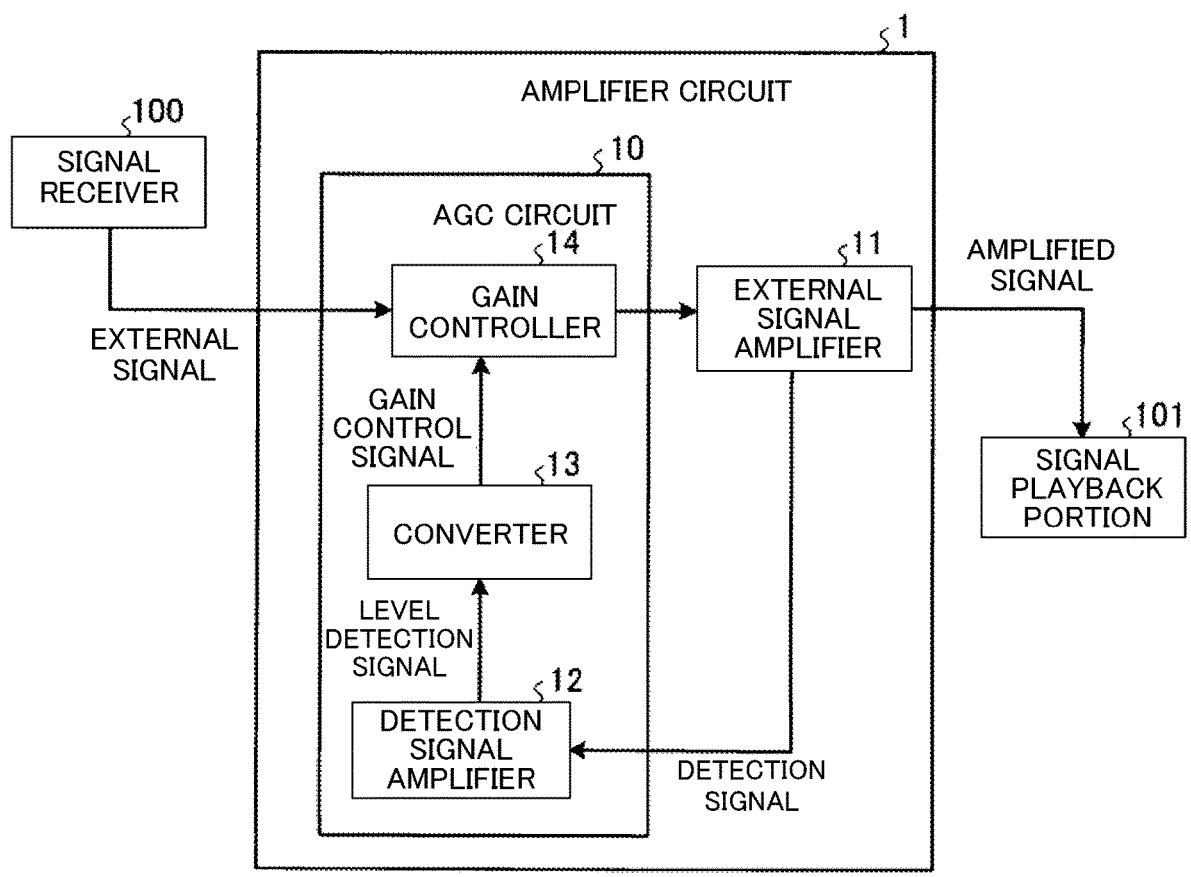
FIG. 2 is a block diagram illustrating a configuration of an amplifier circuit according to the embodiment.

FIG. 2 is a block diagram illustrating a configuration of the amplifier circuit 1 according to the embodiment. The amplifier circuit 1 illustrated in FIG. 2 is included in the antenna amplifier 2 illustrated in FIG. 1.

The amplifier circuit 1 amplifies the external signal received from a signal receiver 100 and transmits the amplified external signal to a signal playback portion 101. The signal receiver 100 is, for example, the antenna A described above and receives the external signal such as the FM broadcast radio wave or the AM broadcast radio wave. The signal playback portion 101 is, for example, the playback apparatus (such as a FM radio or an AM radio) that is installed inside the vehicle and replays the external signal.

As described above, the external signal is transmitted as the FM broadcast radio wave, the AM broadcast radio wave or the like, and is the signal whose level fluctuates. The amplifier circuit 1 automatically adjusts a gain of the received external signal.

That is, the antenna amplifier 2 includes the amplifier circuit 1 so as to transmit the external signal whose gain has been automatically adjusted to the signal playback portion 101. Therefore, according to the embodiment, it is possible to stably replay the external signal received by the signal receiver 100 in the signal playback portion 101.

The amplifier circuit 1 includes an AGC circuit 10 and an external signal amplifier 11. The AGC circuit 10 includes a detection signal amplifier 12, a converter 13 and a gain controller 14.

The external signal amplifier 11 receives the external signal that is transmitted from the signal receiver 100. The external signal amplifier 11 amplifies the received external signal and transmits the amplified external signal (hereinafter, referred to as an amplified signal) to the signal playback portion 101.

The detection signal amplifier 12 receives a detection signal that is shunted from the amplified signal that is transmitted from the external signal amplifier 11. That is, the detection signal is transmitted from the external signal amplifier and used for detecting a level of the amplified signal. The detection signal amplifier 12 amplifies the received detection signal and transmits the amplified detection signal (hereinafter, referred to as a level detection signal) to the converter 13.

The converter 13 receives the level detection signal that is transmitted from the detection signal amplifier 12. The converter 13 converts the level detection signal into a direct current signal and transmits the converted level detection signal (hereinafter, referred to as a gain control signal) to the gain controller 14.

The gain controller 14 receives the gain control signal from the converter 13. The gain controller 14 adjusts an output of the external signal that is transmitted to the external signal amplifier 11 according to a value of the gain control signal.

Specifically, when the value of the gain control signal is small (i.e., when a level of the external signal is small), the gain controller 14 reduces an attenuation amount of the external signal and transmits the external signal to the external signal amplifier 11. When the value of the gain control signal is large (i.e., when the level of the external signal is large), the gain controller 14 increases the attenuation amount of the external signal and transmits the external signal to the external signal amplifier 11.

Thus, in the AGC circuit 10, it is possible to automatically control the gain of the external signal that is transmitted to the external signal amplifier 11.

<Details of Amplifier Circuit>

Figure 3:
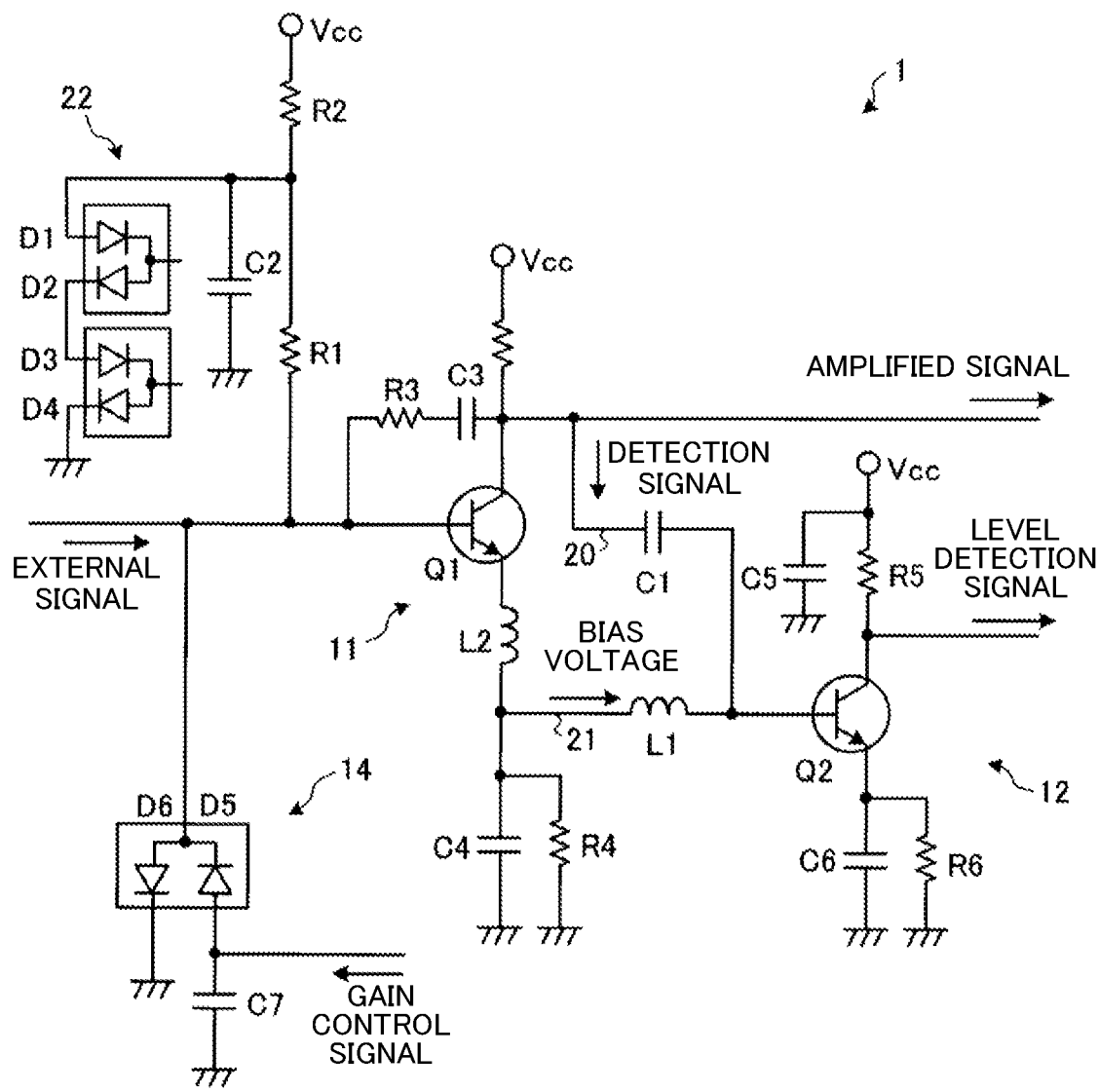
FIG. 3 is a connection diagram illustrating a main part of the amplifier circuit according to the embodiment.
Figure 4:
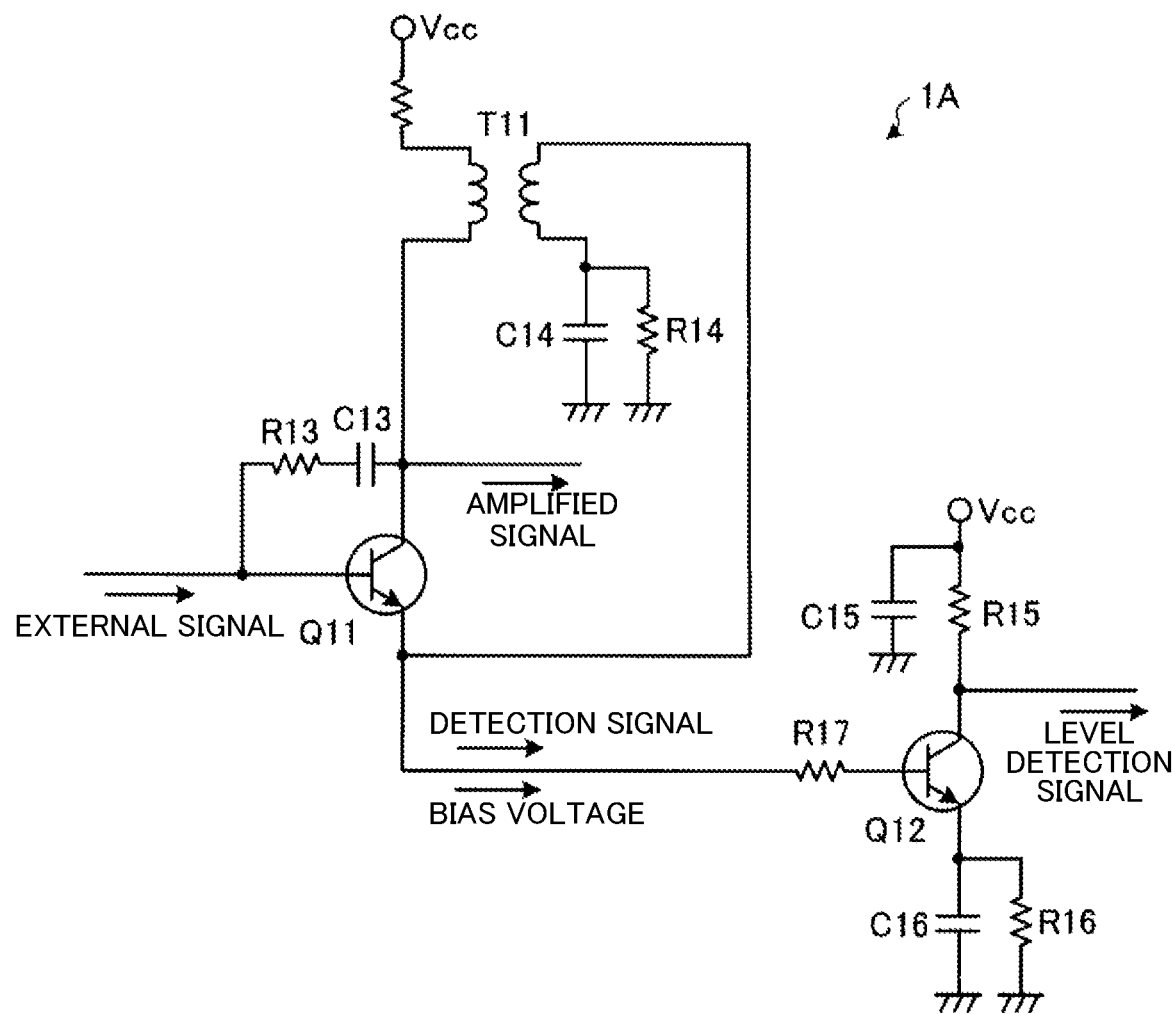
FIG. 4 is a connection diagram illustrating a main part of an amplifier circuit in a conventional example.

Subsequently, description will be made on a detailed configuration of the amplifier circuit 1 with reference to FIG. 3. FIG. 3 is a connection diagram illustrating a main part of the amplifier circuit 1 according to the embodiment. The amplifier circuit 1 includes a first transistor Q1, a second transistor Q2, a first pathway 20 and a second pathway 21. Examples of the first transistor Q1 and the second transistor Q2 include a bipolar transistor.

The external signal that is transmitted from the signal receiver 100 is input to a base of the first transistor Q1 of the amplifier circuit 1. The external signal is amplified by the first transistor Q1 and the amplified external signal (i.e., the amplified signal) is output from a collector. That is, the first transistor Q1 is included in the external signal amplifier 11 described above.

The first pathway 20 is provided between the collector of the first transistor Q1 and a base of the second transistor Q2. The detection signal shunted from the amplified signal is input from the collector of the first transistor Q1 to the base of the second transistor Q2 via the first pathway 20.

The detection signal is amplified by the second transistor Q2 and the amplified detection signal (i.e., the level detection signal) is output from a collector of the second transistor Q2. That is, the second transistor Q2 is included in the detection signal amplifier 12 described above.

As described above, according to the embodiment, by providing the first pathway 20, it is possible to supply a sufficient level of the detection signal from the first transistor Q1 to the second transistor Q2 without using a transformer.

On the other hand, since a collector voltage of the first transistor Q1 is changed by variation of a power supply voltage Vcc, the collector voltage of the first transistor Q1 cannot be used as a bias voltage to stably operate the second transistor Q2.

Therefore, according to the embodiment, the bias voltage is supplied from an emitter of the first transistor Q1 to the base of the second transistor Q2. Specifically, the second pathway 21 is provided between the emitter of the first transistor Q1 and the base of the second transistor Q2 and the bias voltage is input from the emitter of the first transistor Q1 to the base of the second transistor Q2 via the second pathway 21.

Here, since an emitter voltage of the first transistor Q1 is sufficiently stabilized by a current feedback bias circuit that includes a resistance R1, a resistance R2 and a resistance R4, it is possible to stably operate the second transistor Q2. Therefore, according to the embodiment, by providing the second pathway 21, it is possible to stably amplify the detection signal by the second transistor Q2.

As described above, according to the embodiment, by providing the first pathway 20 and the second pathway 21, it is possible to stably operate the second transistor Q2 and it is possible to supply the sufficient level of the detection signal from the first transistor Q1 to the second transistor Q2 without using the transformer.

According to the embodiment, it is preferable that a choke coil L1 is provided in the second pathway 21. As a result, it is possible to prevent the detection signal that is output from the collector of the first transistor Q1 and has a high frequency component from being leaked to the emitter of the first transistor Q1 via the second pathway 21.

It is preferable that a capacitor C1 is provided in the first pathway 20. As a result, it is possible to prevent the bias voltage that is output from the emitter of the first transistor Q1 and is almost constant from being leaked to the collector of the first transistor Q1 via the first pathway 20.

Other parts of the amplifier circuit 1 will be described below. The base of the first transistor Q1 is connected to the power supply voltage Vcc via the resistance R1 and the resistance R2. A constant voltage circuit 22 is connected between the resistance R1 and the resistance R2.

The constant voltage circuit 22 is, for example, configured to be connected to ground via a pin diode D1, a pin diode D2, a pin diode D3 and a pin diode D4 that are connected in a forward direction and in series, respectively, and configured to be connected to ground via a capacitor C2 between the resistance R1 and the resistance R2.

It is possible to supply a more stable bias voltage to the base of the first transistor Q1 by the constant voltage circuit 22. Therefore, according to the embodiment, it is possible to more stably amplify the external signal by the first transistor Q1. The constant voltage circuit 22 is not limited to a configuration in which the pin diode D1, the pin diode D2, the pin diode D3 and the pin diode D4, and the capacitor C2 are used.

The collector of the first transistor Q1 is connected to the power supply voltage Vcc and is connected to the base of the first transistor Q1 via a capacitor C3 and a resistance R3. The emitter of the first transistor Q1 is connected to ground via a choke coil L2, and a capacitor C4 and the resistance R4 that are connected in parallel. The choke coil L2 is placed in the second pathway 21 described above.

The collector of the second transistor Q2 is connected to the power supply voltage Vcc via a resistance R5. A point between the resistance R5 and the power supply voltage Vcc is connected to ground via a capacitor C5. The emitter of the second transistor Q2 is connected to ground via a capacitor C6 and a resistance R6 that are connected in parallel.

According to the embodiment, the gain controller 14 is connected to an upstream side of the base of the first transistor Q1 in the amplifier circuit 1. The gain controller 14 is a so-called attenuator circuit and is for example configured to include a pin diode D5, a pin diode D6 and a capacitor C7.

In the gain controller 14, the pin diode D5 and the pin diode D6 are connected in a forward direction and in series, and an anode of the pin diode is connected to ground via the capacitor C7 and a cathode of the pin diode D6 is connected to ground. A point between the pin diode D5 and the pin diode D6 is connected to an upstream side of the base of the first transistor Q1. The gain control signal converted by the converter 13 illustrated in FIG. 2 is input between the pin diode D5 and the capacitor C7.

In this gain controller 14, when the value of the gain control signal that is input is small (i.e., when the level of the external signal is small), a resistance value of the pin diode D6 increases. Therefore, when the value of the gain control signal that is input is small, almost no external signal flows through the pin diode D6. As a result, the external signal that is input to the first transistor Q1 can be attenuated by a small amount.

On the other hand, when the value of the gain control signal that is input to the gain controller 14 is large (i.e., when the level of the external signal is large), the resistance value of the pin diode D6 decreases. Therefore, when the value of the gain control signal that is input is large, a large amount of the external signal flows through the pin diode D6. As a result, the external signal that is input to the first transistor Q1 can be largely attenuated.

As described above, in the gain controller 14 according to the embodiment, the external signal that is input to the base of the first transistor Q1 can be attenuated based on the value of the gain control signal converted by the converter 13. The gain controller 14 is not limited to a configuration in which the pin diode D5, the pin diode D6 and the capacitor C7 described above are used.

Although details of the converter 13 are not illustrated in FIG. 3, it is possible to use an existing circuit (such as an envelope detection circuit) that can convert the level detection signal having a high frequency component into the gain control signal as a direct current signal.

Although the embodiment of the invention has been described above, the invention is not limited to the foregoing embodiment and various changes can be made to the invention without departing from the spirit of the invention. For example, although the amplifier circuit 1 that is used for the antenna amplifier 2 has been described in the embodiment, the invention is not limited to a case in which the amplifier circuit 1 is used for an antenna amplifier. The amplifier circuit 1 may be used for any device that performs automatic gain control.

As illustrated in FIG. 1, when the FM antenna A1 and the AM antenna A2 are connected to the antenna amplifier 2, it is preferable that the amplifier circuit 1 for the FM antenna A1 and the amplifier circuit 1 for the AM antenna A2 are provided in the antenna amplifier 2, respectively.

Since the amplifier circuit 1 illustrated in FIG. 3 is merely one example, one or more resistances, capacitors and choke coils illustrated in FIG. 3 may be omitted as appropriate and one or more resistances, capacitors, choke coils and the like may be added to the amplifier circuit 1 illustrated in FIG. 3 as appropriate.

The amplifier circuit 1 according to the embodiment includes the first transistor Q1, the second transistor Q2, the first pathway 20 and the second pathway 21. The first transistor Q1 amplifies the external signal that is input from outside. The second transistor Q2 amplifies the detection signal that detects the level of the external signal. The first pathway 20 is connected between the collector of the first transistor Q1 and the base of the second transistor Q2 to supply the detection signal that is output from the collector of the first transistor Q1 to the base of the second transistor Q2. The second pathway 21 is connected between the emitter of the first transistor Q1 and the base of the second transistor Q2 to supply the bias voltage from the emitter of the first transistor Q1 to the base of the second transistor Q2. Thus, it is possible to supply the sufficient level of the detection signal from the first transistor Q1 to the second transistor Q2 without using the transformer. In addition, it is possible to supply the stable bias voltage to the second transistor Q2.

The amplifier circuit 1 according to the embodiment further includes the gain controller 14 that attenuates the external signal that is input to the base of the first transistor Q1 based on the detection signal (the level detection signal) amplified by the second transistor Q2. Thus, it is possible to automatically control the gain of the external signal that is transmitted to the external signal amplifier 11.

The amplifier circuit 1 according to the embodiment includes the choke coil L1 in the second pathway 21. Thus, it is possible to prevent the detection signal that is output from the collector of the first transistor Q1 and has a high frequency component from being leaked to the emitter of the first transistor Q1 via the second pathway 21.

The amplifier circuit 1 according to the embodiment includes the capacitor C1 in the first pathway 20. Thus, it is possible to prevent the bias voltage that is output from the emitter of the first transistor Q1 and is almost constant from being leaked to the collector of the first transistor Q1 via the first pathway 20.

The amplifier circuit 1 according to the embodiment includes the constant voltage circuit 22 that keeps the bias voltage that is supplied to the base of the first transistor Q1 constant. Thus, it is possible to stably amplify the external signal by the first transistor Q1.

While the invention has been shown and described in detail, the foregoing description is in all aspects illustrative and not restrictive. It is therefore understood that numerous other modifications and variations can be devised without departing from the scope of the invention.

What is claimed is:

1. An amplifier circuit comprising:
   a first transistor that amplifies an external signal that is input from outside the amplifier circuit;
   a second transistor that amplifies a detection signal that detects a level of the external signal;
   a first pathway that is connected between a collector of the first transistor and a base of the second transistor to supply the detection signal that is output from the collector of the first transistor to the base of the second transistor;
   a second pathway that is connected between an emitter of the first transistor and the base of the second transistor to supply a bias voltage from the emitter of the first transistor to the base of the second transistor; and
   a choke coil that is located in the second pathway.

2. The amplifier circuit according to claim 1, further comprising a gain controller that attenuates the external signal that is input to a base of the first transistor based on the detection signal amplified by the second transistor.

3. The amplifier circuit according to claim 1, further comprising a capacitor that is located in the first pathway.

4. An amplifier circuit comprising:
   a first transistor that amplifies an external signal that is input from outside the amplifier circuit;
   a second transistor that amplifies a detection signal that detects a level of the external signal;
   a first pathway that is connected between a collector of the first transistor and a base of the second transistor to supply the detection signal that is output from the collector of the first transistor to the base of the second transistor;
   a second pathway that is connected between an emitter of the first transistor and the base of the second transistor to supply a bias voltage from the emitter of the first transistor to the base of the second transistor; and
   a constant voltage circuit that maintains a second bias voltage that is supplied to the base of the first transistor constant.

5. The amplifier circuit according to claim 1, wherein:
   the first pathway includes (i) a first upstream portion that extends between the collector of the first transistor and a merge point, and (ii) a downstream portion that extends between the merge point and the base of the second transistor,
   the second pathway includes (a) a second upstream portion that extends between the emitter of the first transistor and the merge point, and (b) the downstream portion that extends between the merge point and the base of the second transistor, and
   a capacitor is located in the first upstream portion of the first pathway, the capacitor preventing the bias voltage supplied from the emitter of the first transistor from being leaked to the collector of the first transistor.

6. The amplifier circuit according to claim 1, wherein:
   the first pathway includes (i) a first upstream portion that extends between the collector of the first transistor and a merge point, and (ii) a downstream portion that extends between the merge point and the base of the second transistor,
   the second pathway includes (a) a second upstream portion that extends between the emitter of the first transistor and the merge point, and (b) the downstream portion that extends between the merge point and the base of the second transistor, and
   a choke coil is located in the second upstream portion of the second pathway, the choke coil preventing the detection signal output from the collector of the first transistor from being leaked to the emitter of the first transistor.

7. The amplifier circuit according to claim 1, wherein:
   the first pathway includes (i) a first upstream portion that extends between the collector of the first transistor and a merge point, and (ii) a downstream portion that extends between the merge point and the base of the second transistor,
   the second pathway includes (a) a second upstream portion that extends between the emitter of the first transistor and the merge point, and (b) the downstream portion that extends between the merge point and the base of the second transistor,
   a capacitor is located in the first upstream portion of the first pathway, the capacitor preventing the bias voltage supplied from the emitter of the first transistor from being leaked to the collector of the first transistor, and
   a choke coil is located in the second upstream portion of the second pathway, the choke coil preventing the detection signal output from the collector of the first transistor from being leaked to the emitter of the first transistor.

* * * * *